(12) United States Patent
Kuroda et al.

(10) Patent No.: US 7,009,303 B2
(45) Date of Patent: Mar. 7, 2006

(54) MULTI-CHIP MODULE

(75) Inventors: Hiroshi Kuroda, Akishima (JP); Shinpei Ishida, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/971,042

(22) Filed: Oct. 25, 2004

(65) Prior Publication Data

US 2005/0104183 A1    May 19, 2005

(30) Foreign Application Priority Data

Nov. 17, 2003    (JP)    ............... 2003-387188

(51) Int. Cl.
  *H01L 23/02*    (2006.01)
  *H01L 29/40*    (2006.01)
(52) U.S. Cl. ............... 257/777; 257/781; 257/784; 257/685
(58) Field of Classification Search ............... 257/777, 257/778, 781, 784, 685, 686, 723
See application file for complete search history.

(56) References Cited

U.S. PATENT DOCUMENTS 5,323,060 A * 6/1994 Fogal et al. ............... 257/777
5,471,369 A * 11/1995 Honda et al. ............... 361/813
5,614,766 A * 3/1997 Takasu et al. ............... 257/777
6,353,263 B1 * 3/2002 Dotta et al. ............... 257/777
6,407,456 B1 * 6/2002 Ball ............... 257/777

FOREIGN PATENT DOCUMENTS

| JP | 6-224360 | 8/1994 |
| JP | 2003-7963 | 1/2003 |
| JP | 2003-224242 | 8/2003 |

* cited by examiner

*Primary Examiner*—Jasmine Clark
(74) *Attorney, Agent, or Firm*—Miles & Stockbridge P.C.

(57) ABSTRACT

Disclosed here is a multi-chip module enhanced in performance and reduced in size. A second semiconductor chip having bonding pads at the periphery of its surface is mounted over a first semiconductor chip laid out over a surface of a substrate back to back and a spacer is provided at a portion of the second semiconductor chip surface except for a predetermined area that includes the portion where the bonding pads are formed while a third semiconductor chip is mounted over the spacer, the third semiconductor having the same circuit function as the second semiconductor chip and oriented similarly to the second semiconductor chip. The bonding pads of the second and third semiconductor chips are connected to their corresponding electrodes formed over the substrate through bonding wires respectively, then the first to third semiconductor chips and the bonding wires provided over the substrate are all sealed by a sealing agent.

10 Claims, 10 Drawing Sheets

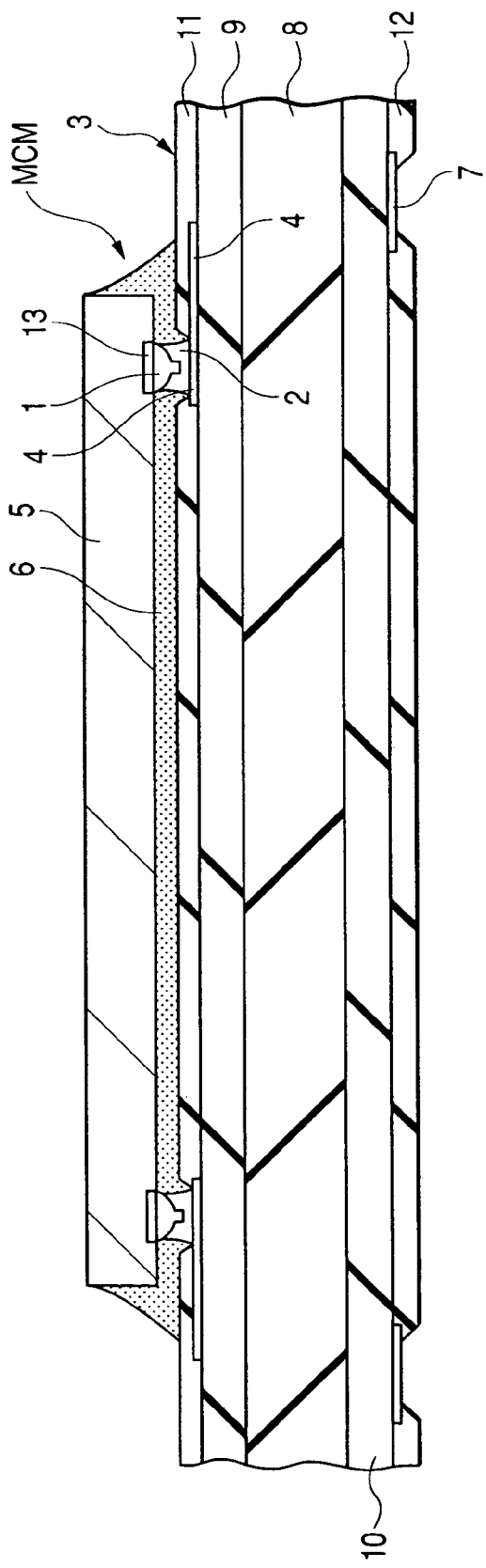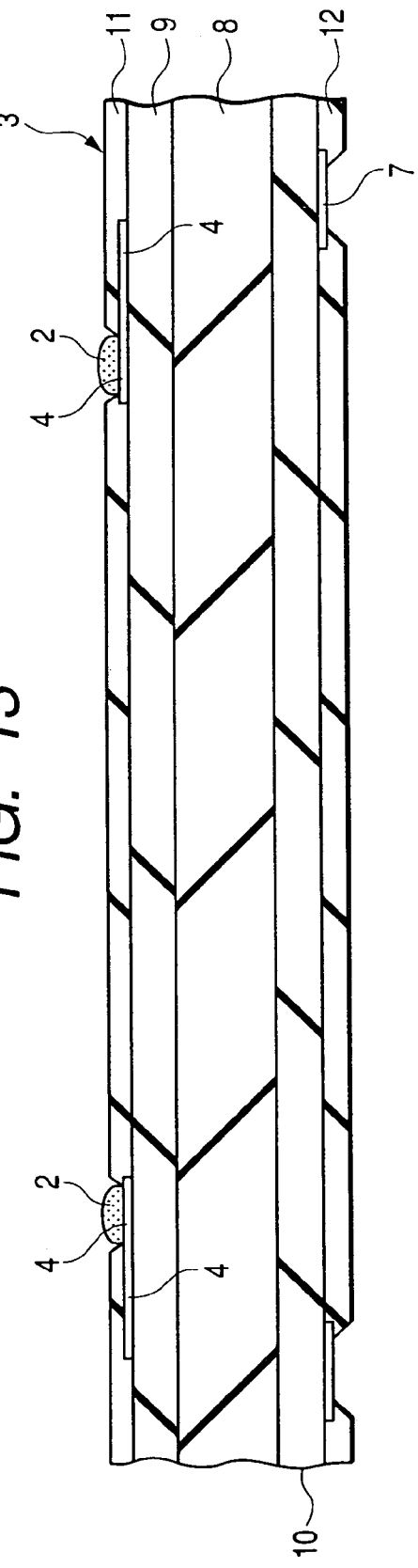

MULTI-CHIP MODULE

CROSS-REFERENCE TO RELATED APPLICATION

The present invention claims priority from Japanese patent application No. 2003-387188 filed on Nov. 17, 2003, the content of which is hereby incorporated by reference into this application.

BACKGROUND OF THE INVENTION

The present invention relates to a multi-chip module (MCM), particularly to a technique to be applied effectively to a multi-chip module structured so that a plurality of semiconductor chips, each having a function different from those of others, are mounted on one substrate, thereby the multi-chip module is configured as one semiconductor integrated circuit device.

According to the so-called multi-chip module technique, a plurality of semiconductor chips are mounted on one substrate provided with a plurality of internal wired lines and a plurality of external terminals so that those semiconductor chips are united with the substrate into one integrated circuit device. For such an integrated circuit device, Japanese Unexamined Patent Publication Nos. Hei 6(1994)-224360, 2003-7963, and 2003-224242 disclose methods that provide the object integrated circuit device in which a plurality of chips are stacked with bonding wires. Japanese Unexamined Patent Publication No. Hei 6(1994)-224360 discloses a method that provides step-cutting on the back side of each chip mounted in such a device. Japanese Unexamined Patent Publication No. 2003-7963 discloses a method that provides each mounted chip with a spacer and Japanese Unexamined Patent Publication No. 2003-224242 discloses a method that provides each mounted chip with a notch at its back side.

[Patent document 1] Japanese Unexamined Patent Publication No. Hei 6(1994)-224360

[Patent document 2] Japanese Unexamined Patent Publication No. 2003-7963

[Patent document 3] Japanese Unexamined Patent Publication No. 2003-224242

SUMMARY OF THE INVENTION

In the progress of the semiconductor technology in recent years, there have appeared techniques for configuring a plurality of semiconductor chips used to realize such electronic systems as microcomputer chips, DRAM chips, and flash memory chips as one package type semiconductor device respectively. However, if a plurality of semiconductor devices, each being packaged independently with use of an ordinary packaging technique employed for QFP (Quad Flat Package), CSP (Chip Size Package or Chip Scale Package), and BGA (Ball Grid Array) are to be mounted on such a substrate as a printed wired substrate instead of using a plurality of semiconductor chips, it is difficult to reduce the distance between semiconductor chips and their wiring distances, so that the signal delay is promoted by the wiring, thereby the devices come to be limited naturally in realization of faster operations and smaller sizes.

According to the multi-chip module technique as described above, however, a plurality of so-called very small bare chips come to be packaged into one semiconductor device. The technique can thus reduce the wiring distance between the chips and improve the characteristics of each of the semiconductor devices. This is why both of the size of the semiconductor device itself and its mounting area are reduced, thereby realizing a smaller semiconductor module.

As semiconductor chips to be used for a multi-chip module, it is preferable to select those that are closely related with each other, for example, a microcomputer chip and a DRAM chip or flash memory chip to be connected to the microcomputer chip. This is because selection of a combination of a plurality of semiconductor chips related closely with each other makes it possible to bring the features of the multi-chip module to be composed of those chips into full play. In the patent documents 1 to 3, however, no consideration is taken to the improvement of the total performance of the multi-chip module nor to the reduction of the module in size. Respective chips are just stacked in the module.

Under such circumstances, it is an object of the present invention to provide a multi-chip module enhanced more in performance and reduced more in size. The above and further objects and novel features of the present invention will more fully appear from the following detailed description when the same is read in conjunction with the accompanying drawings.

The typical one of the objects of the present invention disclosed in this specification will be summarized as follows. To achieve the above object, the multi-chip module of the present invention is structured so that a second semiconductor chip provided with bonding wires at the periphery of its surface is mounted over a first semiconductor chip laid out over a surface of a substrate back to back and a spacer is provided at a portion of the surface of the second semiconductor chip. The spacer provided portion does not include a predetermined area that includes the portion where the bonding pads are formed. And, a third semiconductor chip is mounted over the spacer. The third semiconductor chip has the same circuit function as that of the second semiconductor chip and is oriented similarly to the second semiconductor chip. The bonding pads of the second and third semiconductor chips are connected to their corresponding electrodes formed over the substrate through bonding wires, then the first to third semiconductor chips, as well as the bonding wires provided over the substrate are all sealed by a sealing agent.

The first semiconductor chip laid out over the surface of the substrate can omit an area larger than the first semiconductor chip therefrom. The area is used to connect the first semiconductor chip to a favorable signal transmission path realized over the substrate. The substrate is thus reduced in size. In addition, the second and third semiconductor chips are connected to the substrate under the same condition, thereby the circuit performance is doubled.

BRIEF DESCRIPTION OF THE DRAWINGS

FIG. 12 is a cross sectional view of a land grid array type multi-chip module in the above embodiment of the present invention;

FIG. 13 is another cross sectional view of the land grid array type multi-chip module in the above embodiment of the present invention;

DETAILED DESCRIPTION OF THE PREFERRED EMBODIMENTS

FIGS. 1 through 6 show cross sectional views of a multi-chip module in an embodiment of the present invention. In FIGS. 1 through 6, how to assemble the multi-chip module is shown as an assembly flowchart. The multi-chip module in this embodiment is configured by application specified integrated circuits, that is, a microcomputer LSI that includes a CPU composed of a specific purpose IC (hereinafter, to be referred to simply as ASIC), two synchronous dynamic random access memories (hereinafter, to be referred to simply as SDRAM respectively), and a flash EEPROM (Flash Electrically Erasable and Programmable Read Only Memory; hereinafter, to be referred to simply as FLASH) therein. Those components are stacked in the module.

Although not restricted specially, the sizes of the semiconductor chips to be stacked in the module will be as follows: the ASIC 500 is 5.75×5.75; the SDRAM 300/301 is 6.84×6.80; and the FLASH 200 is 8.51×5.82. The SDRAM 300/301 has a storage capacity of about 128 MB and the total capacity of the two memories SDRAM thus becomes 256 MB. The FLASH 200 has a storage capacity of 128 MB. Some types of SDRAMs have a 256 MB per chip respectively. If two 128 MB SDRAMs are stacked, however, the semiconductors 200 and 500 become almost the same in capacity, so that they can be mounted over a smaller substrate, for example, over a 13×13 substrate.

Figure 1:
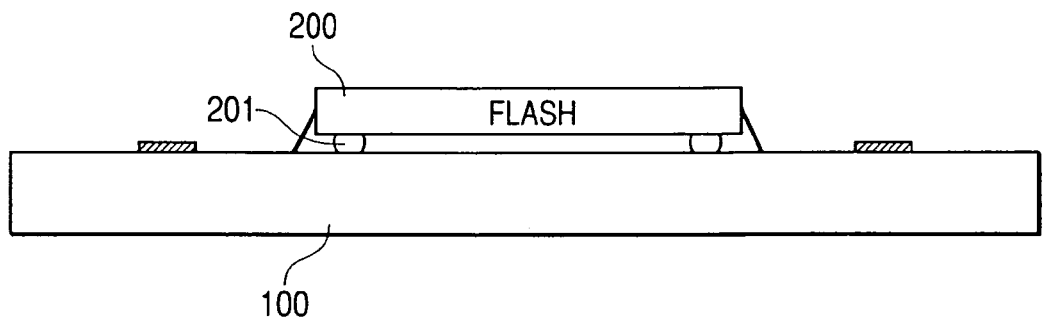
FIG. 1 is a cross sectional view of a multi-chip module in an embodiment of the present invention.

In this embodiment, one semiconductor chip except for the two memories SDRAM 300 and 301, that is, the FLASH 200 in the embodiment shown in FIGS. 1 through 6 is laid out over the substrate 100 as shown in FIG. 1. In other words, an Au pump 201 is formed over each pad of the FLASH 200 that is a bare chip and anisotropy conductive film ACF is attached to the pads of the substrate 100 temporarily, then the bare chip FLASH 200 having the Au bumps 201 formed over its pads comes to be mounted over the substrate 100, then thermally press-fit there.

Figure 2:
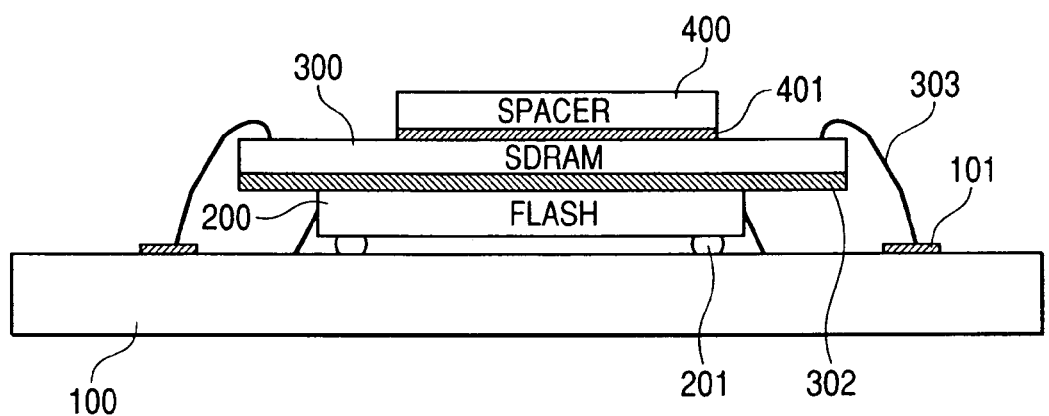
FIG. 2 is another cross sectional view of the multi-chip module in the above embodiment of the present invention.

As shown in FIG. 2, the SDRAM 300 and the FLASH 200 are mounted over the substrate 100 back to back (so that the back sides of both chips come in contact with each other). In other words, the SDRAM 300 and the FLASH 200 are stuck back to back with a thermal setting adhesive or die bond film 302 provided on their back sides, then they are connected to their corresponding electrodes 101 of the substrate 100 through the wires 303 with use of a wire bonding method. After that, a spacer 400 is provided in the center of the chip except for the periphery of the chip that includes the bonding pads formed portion used for wire-bonding the SDRAM 300. Although not restricted specially, a silicon substrate is used to form this spacer 400 and adhered on the object with a thermal setting adhesive or die bond film 401 provided at its back side so as to equalize the thermal expansion rate among the stacked semiconductor chips.

Figure 3:
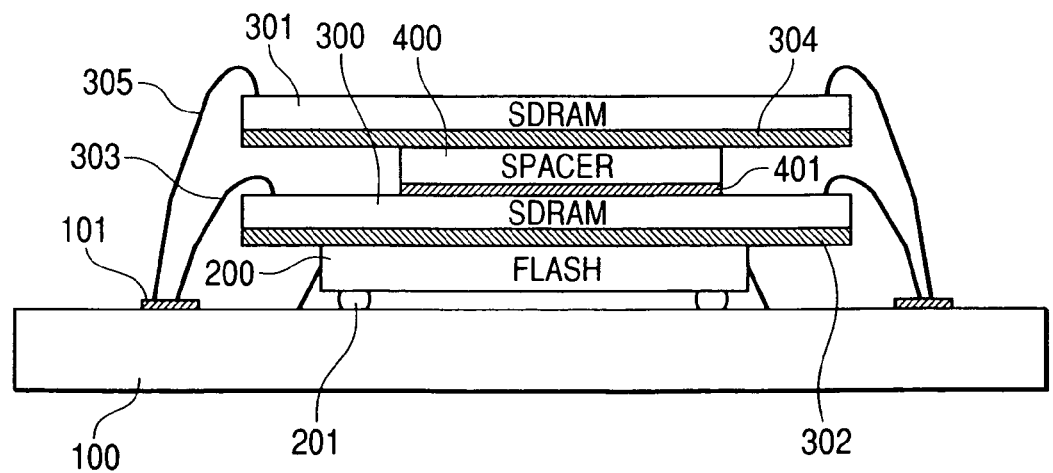
FIG. 3 is still another cross sectional view of the multi-chip module in the above embodiment of the present invention.

As shown in FIG. 3, the SDRAM 301 is mounted over the surface of the spacer 400. In other words, the SDRAM 301 is adhered on the spacer 400 with the thermal setting adhesive or die bond film 304 provided at its back side and connected to the corresponding electrodes of the substrate 100 through the wires 305 with use of a wire bonding method. At that time, the die bonding film 304 provided at the back side of the upper layer side SDRAM 301 can also be used to keep the electrical insulation properties even when the wires 303 provided at the lower layer side SDRAM 300 come in contact with the back side of the upper layer side SDRAM 301. And, the above electrical insulation quality should preferably be maintained by applying a coat of the adhesive all over the back side of the upper layer side SDRAM 301 even when the thermal setting adhesive is to be used.

Figure 4:
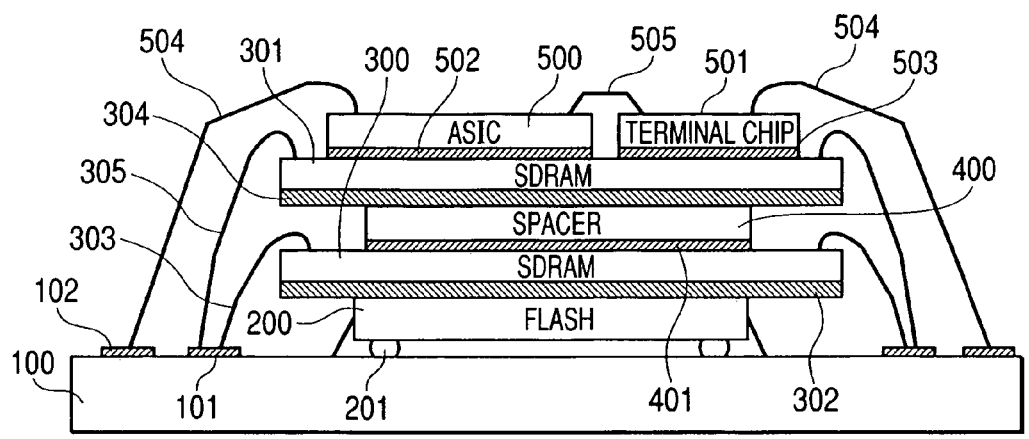
FIG. 4 is still another cross sectional view of the multi-chip module in the above embodiment of the present invention.

As shown in FIG. 4, the ASIC 500 is mounted in the center of the SDRAM 301 chip except for the chip periphery portion that includes the portion where the bonding pads used for the above wire bonding of the SDRAM 301 are formed. This ASIC 500 is adhered there with a thermosetting adhesive or die bond film 502 provided at its back side. Then, the ASIC 500 is connected to the corresponding electrodes of the substrate through wires 503 with use of a wire bonding method. Because the ASIC 500 is small in size with respect to the SDRAM 300/301 as described above, the wires 502 might come in contact with the SDRAM 301 chip periphery portion provided in the layer formed under the wires 502. To avoid this problem, the ASIC 500 is moved to the left side of the SDRAM 301 in FIG. 4 and fixed there and a terminal chip 501 is disposed at the right side of the SDRAM 301 with the thermosetting adhesive or die bond film 503 provided at its back side. The bonding pad provided at the right side of the ASCI 500 is thus connected to the bonding pads of the terminal chip 501 through the wires 505. And, a bonding pad is provided at the other end of each wiring of which one end is connected to the corresponding bonding pad of the terminal chip 501 and the bonding pad of the terminal chip 501 is connected to the corresponding electrode of the substrate 100 through a wire 504.

Figure 5:
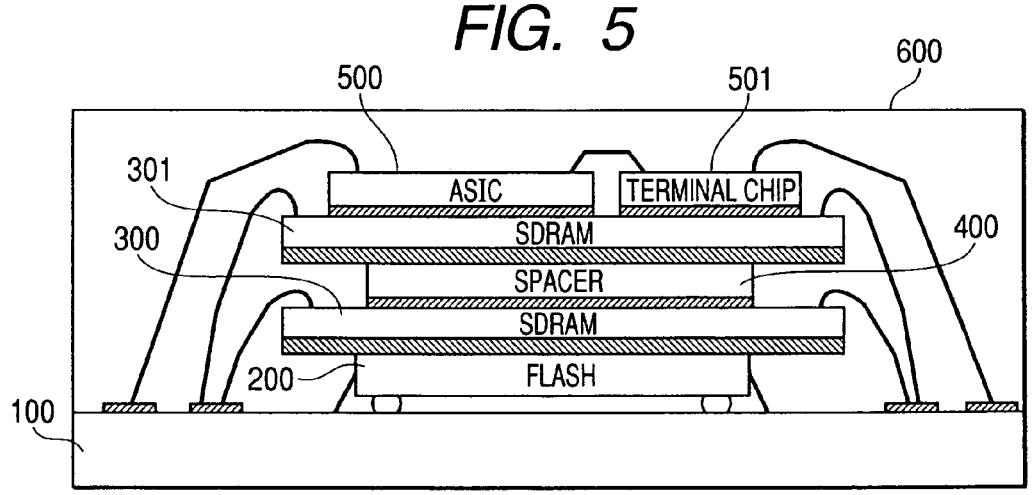
FIG. 5 is still another cross sectional view of the multi-chip module in the above embodiment of the present invention.
Figure 6:
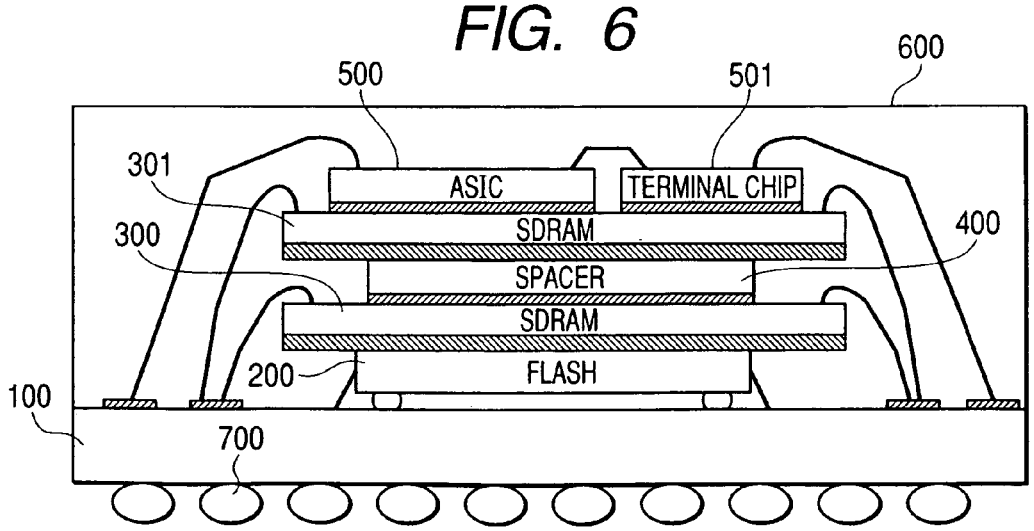
FIG. 6 is still another cross sectional view of the multi-chip module in the above embodiment of the present invention.

As shown in FIG. 5, the FLASH 200, the SDRAMs 300 and 301, the spacer 400, the ASIC 50, the terminal chip 501, as well as the bonding wires provided over those items are all sealed with a resin sealing agent 600, then the assembly is subjected to ball soldering and reflow treatment processes to form an external terminal 700 at the back side of the substrate 100 as shown in FIG. 6. A multi-chip module of the present invention is thus completed.

The FLASH 200 has a plurality of bump electrodes 201 to be laid out at the substrate 100. The FLASH 200 is realized by a technique for forming so-called area array pads as needed, that is, a technique for forming lines that enable re-disposition of pad electrodes (bonding pads) over the circuit-formed surface of the semiconductor chip with an insulator film made of polyimide resin therebetween, then forming pad electrodes (bump connection land electrodes) for the lines. Over the semiconductor chip, elements and wirings are already completed.

The above area array padding technique changes disposition of pad electrodes to be used as external terminals of the object semiconductor chip and assumed to be 0.1 mm to 0.2 mm in diameter at comparatively fine pitches, for example, a few tens of +$\mu$m to 100 $\mu$m to disposition of bump electrodes at comparatively large pitches, for example, 400 $\mu$m to 600 $\mu$m. This is why the area array padding technique is considered to be effective for laying out semiconductor chips provided with many pad electrodes respectively just like the ASIC 500.

The substrate 100 includes an insulated substrate made of glass epoxy or glass, comparatively fine internal wiring formed in a multi-layered wiring structure over the insulated substrate, a plurality of lands connected electrically to their corresponding bump electrodes of the subject semiconductor chip, and a plurality of external terminals. In addition to those lands, the substrate 100 also includes electrodes connected to the corresponding bonding pads of the SDRAMs 300 and 301, as well as the ASIC 500 through wires over the semiconductor chip mounted main surface thereof.

Figure 7A:
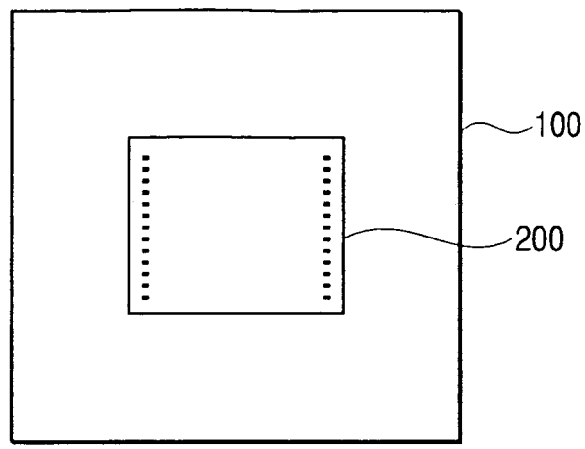
FIG. 7A to 7C are top views of the multi-chip module in the above embodiment of the present invention.

The FLASH 200 in this embodiment is referred to as a so-called AND type one. And, although not restricted specially, the FLASH 200 has no independent address terminal. Address signals are inputted serially to the FLASH 200 through its data terminals in a time division manner. In other words, the flash memory 200 in this embodiment fetches commands used to specify operation modes, as well as addresses and data through the data terminals I/O (7:0). Signals inputted through an input/output buffer are transmitted to a command decoder, an address counter, etc. through internal signal lines provided in the flash memory 200. Consequently, as shown in FIG. 7A, bump electrodes are disposed and laid out along the two sides (short sides in this embodiment) of the semiconductor flash memory chip 200.

Figure 7B:
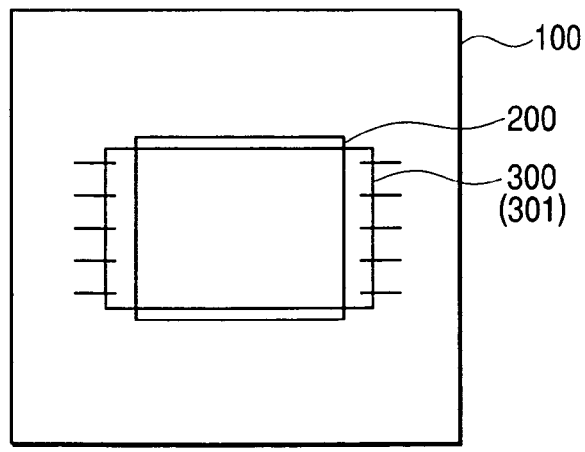
Figure 7C:
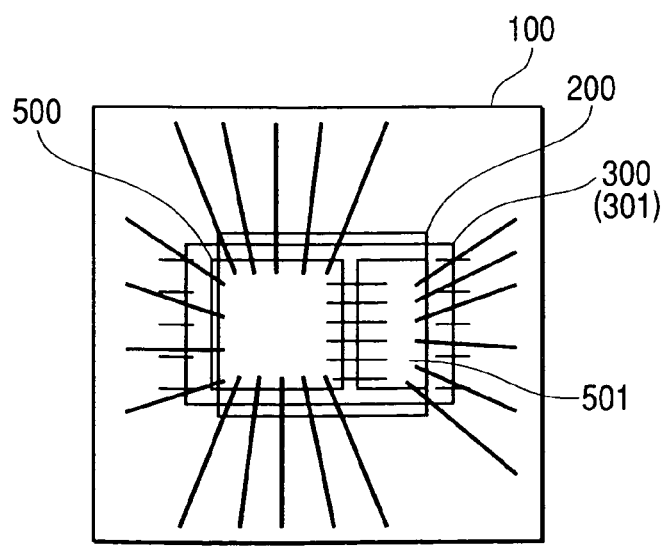

As shown in FIG. 7B, the SDRAM has bonding pads disposed along its two sides (short sides in this embodiment) and the bonding pads are wire-bonded to the corresponding electrodes of the substrate 100 through wires 303 or the like. And, as shown in FIG. 7C, each of the ASIC 500 and the terminal chip 501 has bonding pads disposed at its four periphery portions and wire-bonded to the corresponding electrodes of the substrate 100 radially through wires 503 or the like.

The above components are stacked so that the above four semiconductor chips 200, 300, 301, and 500 are mounted efficiently over the substrate 100. In other words, the FLASH 200 that requires a medium space is laid out over the substrate 100 and the SDRAM 300 is stacked over the FLASH 200 back to back. The SDRAM 301 is then stacked over the SDRAM 300 with the spacer therebetween and the ASIC 500 is stacked over the SDRAM 301. Consequently, the FLASH 200 and the ASIC 500 are mounted entirely in the space of the SDRAMs at a view from the substrate 100. As a result, the four semiconductor chips come to be mounted over the substrate 100 that is as small as 13×13 mm to configure the multi-chip module.

Figure 8:
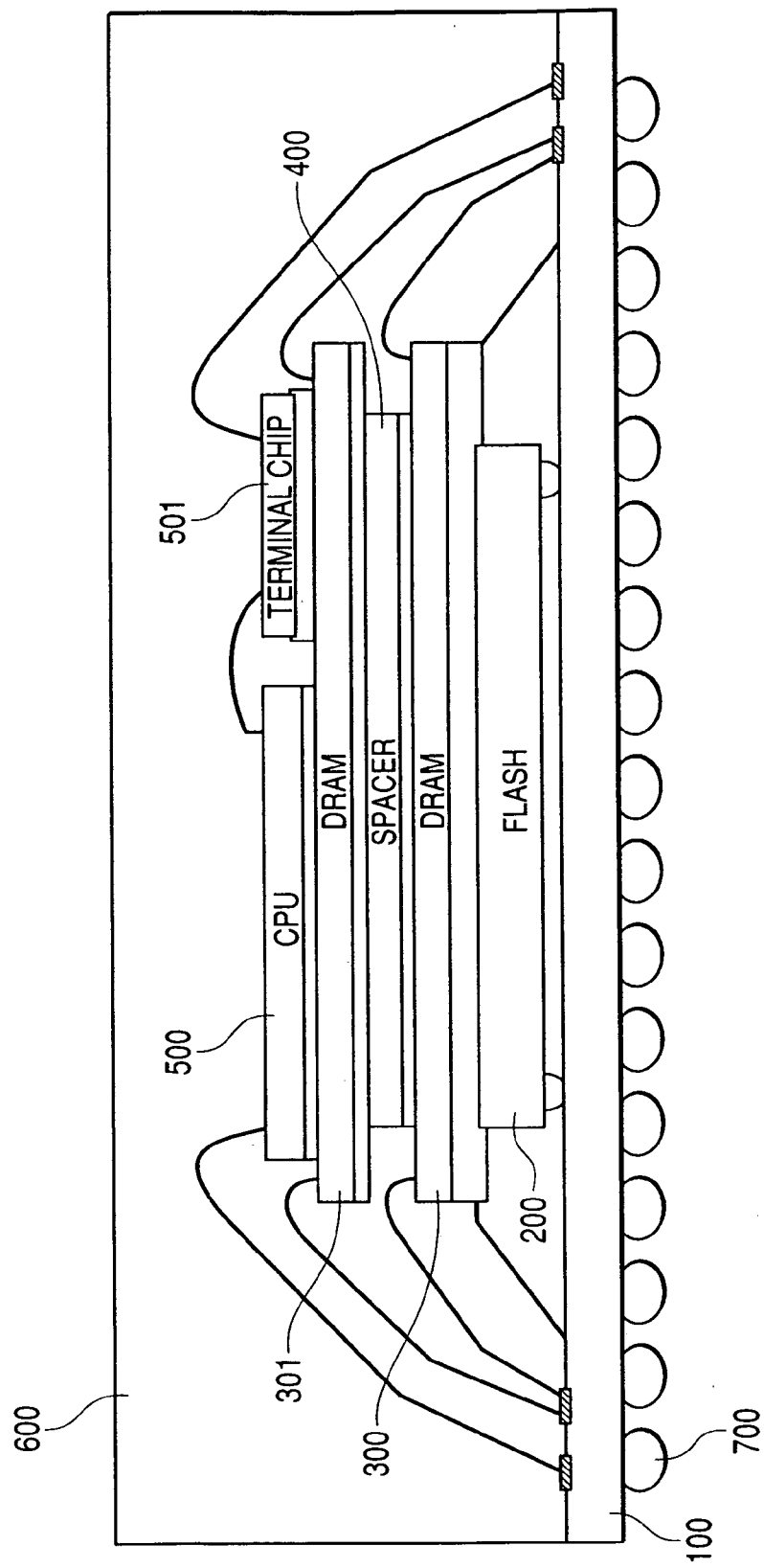
FIG. 8 is still another cross sectional view of the multi-chip module in the above embodiment of the present invention.

FIG. 8 shows a cross sectional view of the multi-chip module in an embodiment of the present invention. This embodiment corresponds to any of the embodiments shown in FIGS. 1 through 6. Each of the SDRAMs 300 and 301, as well as the FLASH 200 is composed of an existing semiconductor chip while the microcomputer LSI (ASIC) 500 comes to have bonding pads to be disposed in accordance with the SDRAM 300/301 combined with the microcomputer LSI (ASIC) 500. The microcomputer LSI (ASIC) 500 is used to configure a specific purpose IC as described above.

In other words, the ASIC 500 is structured as a module or macro cell in which each of those circuit blocks functions independently so as to mount a plurality of circuit blocks including the core block, that is, the CPU (Central processing Unit) to realize an ASIC configuration easily. Each functional unit is enabled to change its scale. The bonding pads of the ASIC 500 corresponding to a selected combination of the memory SDRAM 300/301 and the FLASH 200 as described above are set in accordance with the designed layout of the above functional blocks corresponding to the combination of the functional units as described above.

Figure 9:
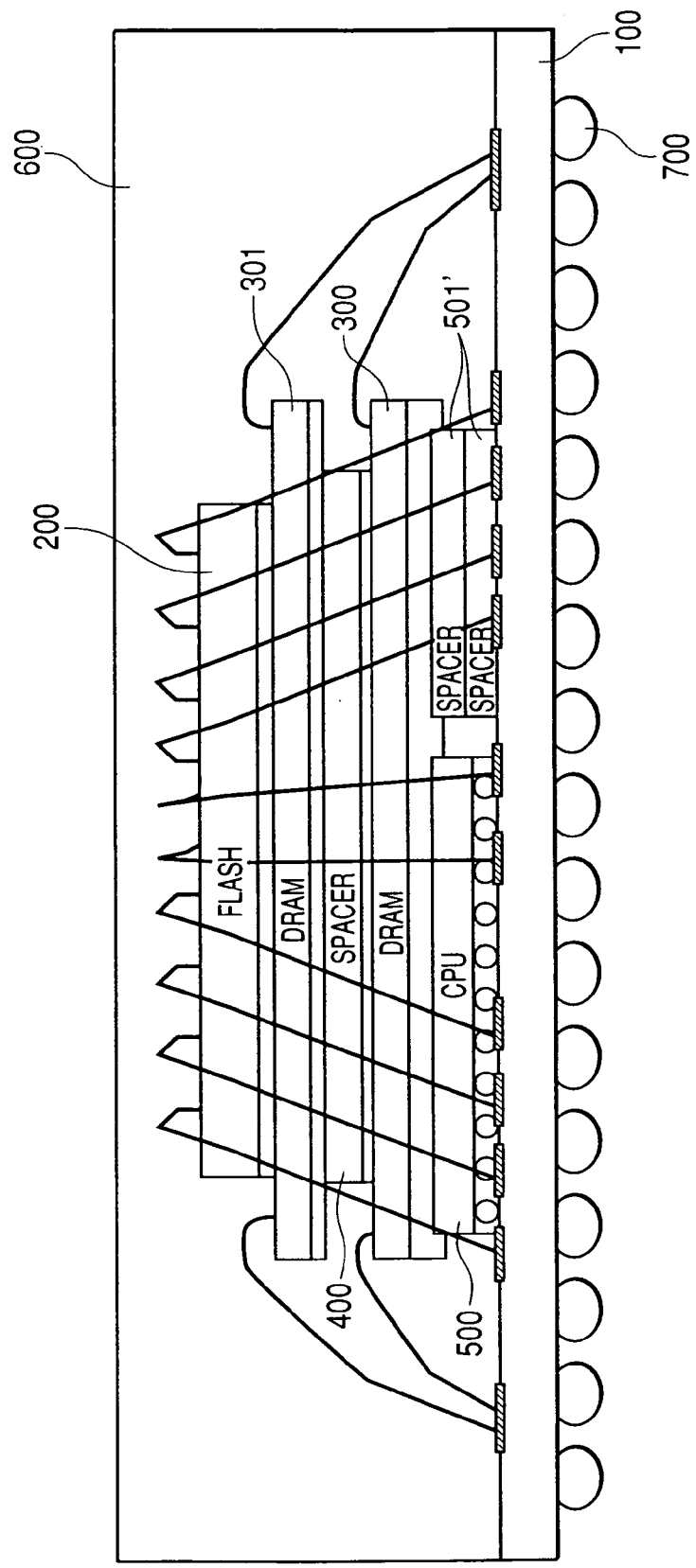
FIG. 9 is still another cross sectional view of the multi-chip module in the above embodiment of the present invention.

FIG. 9 shows another cross sectional view of the multi-chip module in the above embodiment of the present invention. In this embodiment, the ASIC 500 is laid out over the substrate 100 just like that in the above embodiment. In that connection, if the ASIC 500 is smaller than the SDRAM 300/301 to be mounted over the ASIC 500 just like in the above embodiment, a spacer 501' is provided to mount the SDRAM 300/301 stably. In other words, since the ASIC 500 is laid out such a way, the terminal chip 501 as shown in FIG. 8 can be omitted. In other words, the terminal chip 501 is replaced with the spacer 501' here.

Generally, the number of terminals provided for the ASIC 500 is more than that provided for any of the SDRAM 300/301 and the FLASH 200. Consequently, when the ASIC 500 is laid out as described above, the number of bonding electrodes provided at the substrate side is reduced substantially than that when they are wire-bonded electrically as shown in FIG. 8, thereby the substrate is reduced significantly in size. If bonding wires formed comparatively long are used for the microprocessor CPU signal bus required to transmit signals fast, however, a problem might arise from the performance of the circuit operation. For example, the comparatively large inductance component of the bonding wires comes to cause a high frequency clock and the signals synchronized with the clock to slow down. In this embodiment, however, the substrate is reduced in size as described above, as well as the circuit performance is improved.

Figure 10:
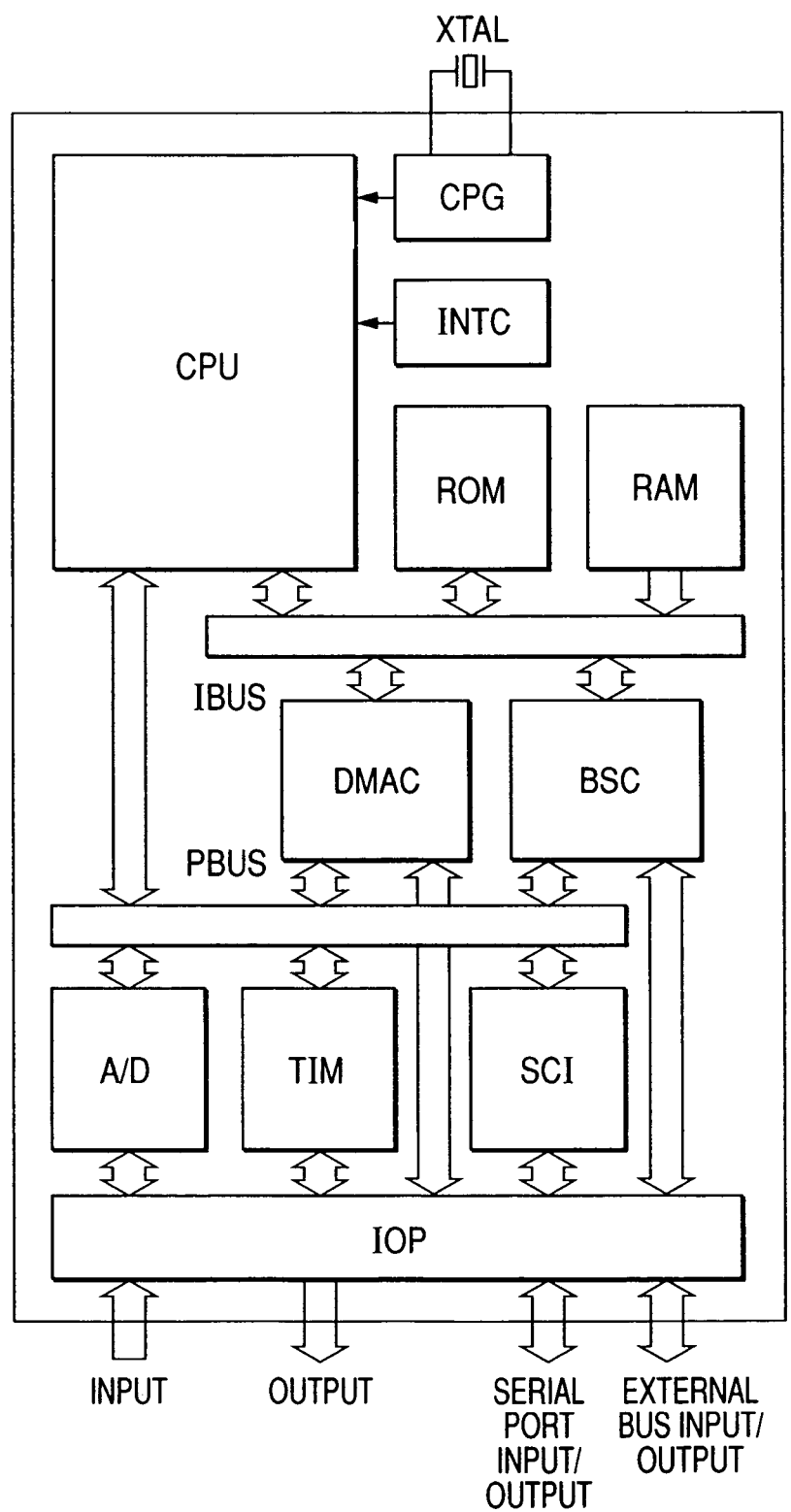
FIG. 10 is a block diagram of a microcomputer LSI in the above embodiment of the present invention.

FIG. 10 shows a block diagram of a microcomputer LSI in the above embodiment of the present invention. Each circuit block shown in FIG. 10 is realized over one substrate made of, for example, single crystal silicon with use of a well-known CMOS (complementary MOS) semiconductor integrated circuit manufacturing technique. Although not restricted specially here, the microcomputer LSI realizes high performance arithmetic processings with use of a RISC (Reduced instruction set computer) type CPU and integrates peripheral devices required for system configuration to be employed for portable devices. The CPU has a RISC type instruction set and each basic instruction is executed through a pipeline processing in a one instruction one state (one system clock) manner. And, this CPU and a data signal processor DSP, as well as the following peripheral circuits that are assumed as core items are mounted in, for example, a portable telephone.

The microcomputer LST includes such internal buses as an I bus, a Y bus, an X bus, an L bus, and a peripheral bus. In addition, a memory XYMEM and a memory controller XYCNT used for image processings are provided as built-in peripheral modules therein so as to configure an object user system with the minimum number of components. The memory XYMEM and the memory controller XYCNT are connected to the buses I, X, Y, and L and used to input/output/display data for image processings.

The I bus is provided with a cache memory CACHE, a cache memory controller CCN, a memory management controller MMU, a translation look aside buffer TLB, an interruption controller INTC, a clock oscillator/watchdog timer CPG/WDT, a video I/O module VIO, and an external interface. The I bus is connected to the memory LSI through this external interface.

The L bus is connected to the cache memory CACHE, the cache memory controller CCN, the memory management controller MMU, the translation look aside buffer TLB, the CPU, the data signal processor DSP, the user break controller UBC, and the advanced user debugger AUD respectively.

The peripheral bus is connected to a 16-bit timer unit TMU, a compare match timer CMT, a serial I/O (with an FIFO) SIOFO, a serial communication interface with a built-in FIFO SCIF1, an $I^2C$ controller $I^2C$, a multi-function interface MFI, a NAND/AND flash interface FCLTL, a user debug interface H-UDI, an ASE memory ASERAM, a pin function controller PFC, and an RCLK operation watchdog timer RWDT respectively. A bus controller BSC and a direct memory access controller DMAC are connected to the peripheral bus and the I bus respectively.

Figure 11:
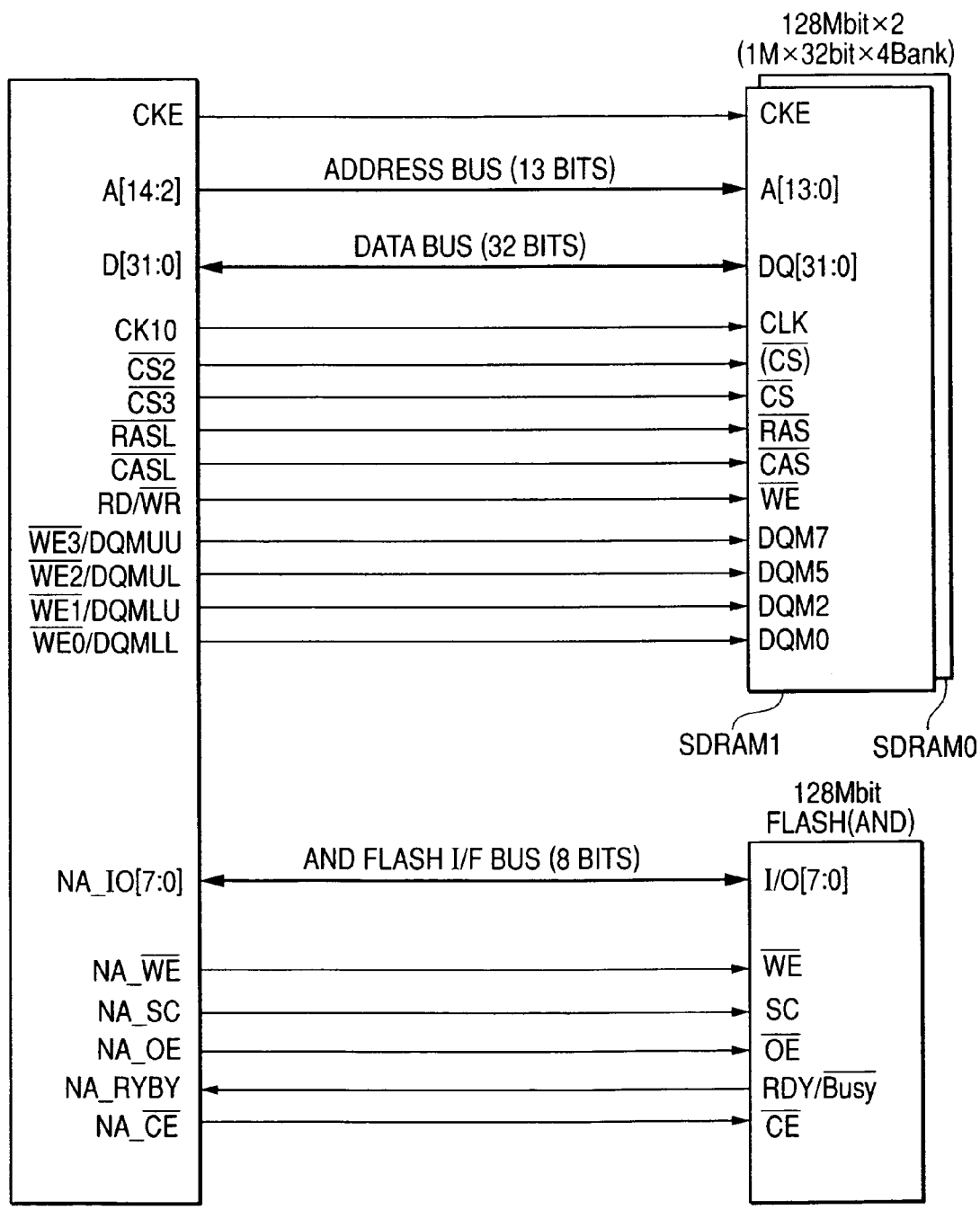
FIG. 11 is a block diagram of the multi-chip module in the above embodiment of the present invention.

FIG. 11 shows a block diagram of the multi-chip module in the above embodiment of the present invention. Concretely, FIG. 11 shows how the microcomputer SH, etc. are connected to the memory SDRAM and the flash memory FLASH electrically with use of their signal terminal names. As shown in FIG. 11, the microcomputer SH and the memory SDRAM that exchange signals with each other are connected to each other through the address bus (13 bits), the data bus (32 bits), and the control bus so as to be enhanced in performance and reduced in size respectively while the features of the multi-chip module, in which the microcomputer SH, the memory SDRAM, and the flash memory FLASH are combined, are used efficiently.

For example, the address bus consists of 13 lines corresponding to the address terminals A0 to A12 of each of the two memories SDRAM0 and SDRAM1. The data bus consists of 32 lines corresponding to the data terminals DQ0 to DQ31 of each of the two memories SDRAM0 and SDRAM1. In the microcomputer SH, the address terminals A2 to A14 are connected to the address bus and the data terminals D0 to D31 are connected to the data bus.

The microcomputer SH has control output terminals of CKIO, CKE, SC2B, CS3B, RASLB, CASLB, RD/WRB, WE3B/DQMUU, WE2B/DQMUL, WE1B/DQMLU, and WE0B/DQMLL that are connected to their corresponding terminals CLK, CKE, CSB, RASB, CASB, WEB, DQM7, DQM5, DQM2, and DQM0 of each of the memories SDRAM0 and SDRAM1. Each of SDRAM0 and SDRAM1 has a chip select signal SC2B/SC3B assigned to itself. SC2B or SC3B generated by the microcomputer SH is used to select one of the two memories SDRAM0 and SDRAM1. Consequently, other signal pins are connected in parallel commonly in each of the memories SDRAM0 and SDRAM1.

In FIG. 11, each terminal name given a letter B corresponds to a logical symbol that assumes a low level having an over-line terminal name as an active level. Each of the terminals WE3B/DQMUU, WE2B/DQMUL, WE1B/DQMLU, and WE0B/DQMLL is a masking signal used to mask writing/reading selectively according to any of the signals WE3B/DQMUU, WE2B/DQMUL, WE1B/DQMLU, and WE0B/DQMLL received through the 32-bit data bus that is divided into 4 8-bit lines.

The microcomputer SH in this embodiment is provided with an interface corresponding to the flash memory FLASH. In other words, the flash memory FLASH is provided with data terminals I/O (7:0) and control signal terminals WEB, SC, OEB, RDY/BusyB, and CEB. Corresponding to those signals, the microcomputer SH is provided with data terminals NA_I/O (7:0) and control signal terminals NA_WEB, NA_SC, NA_OEB, NA_RYBY, and NA_CEB. The writing/reading between the microcomputer SH and the flash memory FLASH is slower than the operation with the SDRAM, so that the MCM is enhanced in performance and reduced in size, since the transmission rate is maintained even when the bonding wires are used as signal transmission paths just like in the embodiment described with reference to FIG. 9.

Next, a description will be made for a land grid array (LGA) type multi-chip module for which Au/solder (Sn or the like) is used for the connection between each semiconductor chip and the substrate and has no ball-like protruded electrodes at the back side of the substrate.

As shown in FIG. 12, the MCM in this embodiment is configured basically just like the multi-chip module MCM described with reference to FIGS. 1 through 6 and 9. The MCM in this embodiment has only a few differences from the above MCM. Concretely, the Au stud bump 1 is connected to a connection part 4 of the substrate 3 through a joint 2 electrically and mechanically. Under-filling resin 6 is filled between the semiconductor chip 5 and the substrate 3 to prevent the semiconductor chip 5 from damages to be caused by concentration of the thermal stress caused by a difference of the thermal expansion factor between the substrate 3 and the semiconductor chip 5. Furthermore, the substrate 3 has land electrodes 7 at its back side. The land electrodes 7 function as external terminals connected electrically, for example, to a printed circuit board (PCB).

In this embodiment, the module has no ball-like protruded electrode as shown in FIGS. 1 through 6, thereby the module is further reduced in both size and thickness. Although not shown, a barrier layer such as Cr/Cu/Au or the like may be formed over the surface of each land electrode 7. The substrate 3 is composed mainly of a rigid substrate (core substrate) 8, soft layers 9 and 10 formed by a build-up method at both sides of this rigid substrate 8, protective films 11 and 12 formed so as to cover the soft layers 9 and 10. Although not illustrated in detail, the rigid substrate 8 and the soft layers 9 and 10 are laminated into a multi-layered wiring layer. Each insulation layer of the rigid substrate 8 is formed as, for example, a highly elastic resin substrate made of glass fiber saturated with epoxy-based or polyimide-based resin and each insulation layer of the soft layers 9 and 10 is formed of, for example, epoxy-based low elastic resin.

Each wiring layer of the multi-layered wiring layer formed in each of the rigid substrate 8 and the soft layers 9 and 10 is a metal layer made of, for example, Cu. The protective films 11 and 12 are made of, for example, polyimide-based resin respectively. The protective film 11 protects mainly the wiring formed in the top wiring layer in the soft layer 9 and assures the adhesive strength with the adhesive resin and/or controls the spreading of the solder with respect to the semiconductor chip 5 when it is mounted. The protective film 12 protects mainly the wiring formed in the top wiring layer in the soft layer 10 and controls the spreading of the solder with respect to the land electrode 7 when in soldering.

Although not restricted specially, the semiconductor chip 5 is configured mainly by a semiconductor substrate, a plurality of semiconductor elements formed over a main surface of this semiconductor substrate, a multi-layered wiring layer consisting of a plurality of insulation layers and wiring layers that are alternately stacked over a main surface of the semiconductor substrate, and a surface protective film (final protective film) formed to cover the multi-layered wiring layer. The semiconductor substrate is made of, for example, single crystal silicon and the insulation layer is formed as, for example, a silicon oxide film. The wiring layer is, for example, a metal film made of aluminum (Al) or an aluminum alloy, or the like. The surface protective film consists of, for example, an insulation film and an organic insulation film made of silicon oxide, silicon nitride, or the like respectively.

A plurality of electrode pads 13 are formed on either one main surface or the other main surface (back side) of the semiconductor chip 5, which are facing each other. The plurality of electrode pads 13 are formed at the top wiring layer of the multi-layered wiring layer of the semiconductor chip 5 and exposed at the bonding openings formed in the surface protective film of the semiconductor chip 5. The plurality of electrode pads 13 are disposed at each side of the semiconductor chip 5. Each of the plurality of electrode pads 13 has a 70 μm×70 μm square shape. And, the plurality of electrode pads 13 are disposed, for example, at about 85 μm pitches.

Over one main surface of the semiconductor chip 3 is a plurality of protruded electrodes that are disposed as a plurality of stud bumps 1 made of, for example, Au. The plurality of stud bumps 1 are disposed over the plurality of electrode pads 13 disposed over one main surface of the semiconductor chip 5 and connected to each other electrically and mechanically. The plurality of stud bumps 1 are formed of Au wires that are thermally press-bonded with use of a ball bonding method that uses supersonic vibration. The ball bonding method forms a ball at the leading edge of an Au wire, then thermally press-bonds the ball to an electrode pad of the semiconductor chip 5 while applying supersonic vibration to the ball. After that, the Au wire is cut off from the ball to form a bump. Consequently, the stud bump formed over the electrode pad is connected firmly to the electrode pad.

Figure 14:
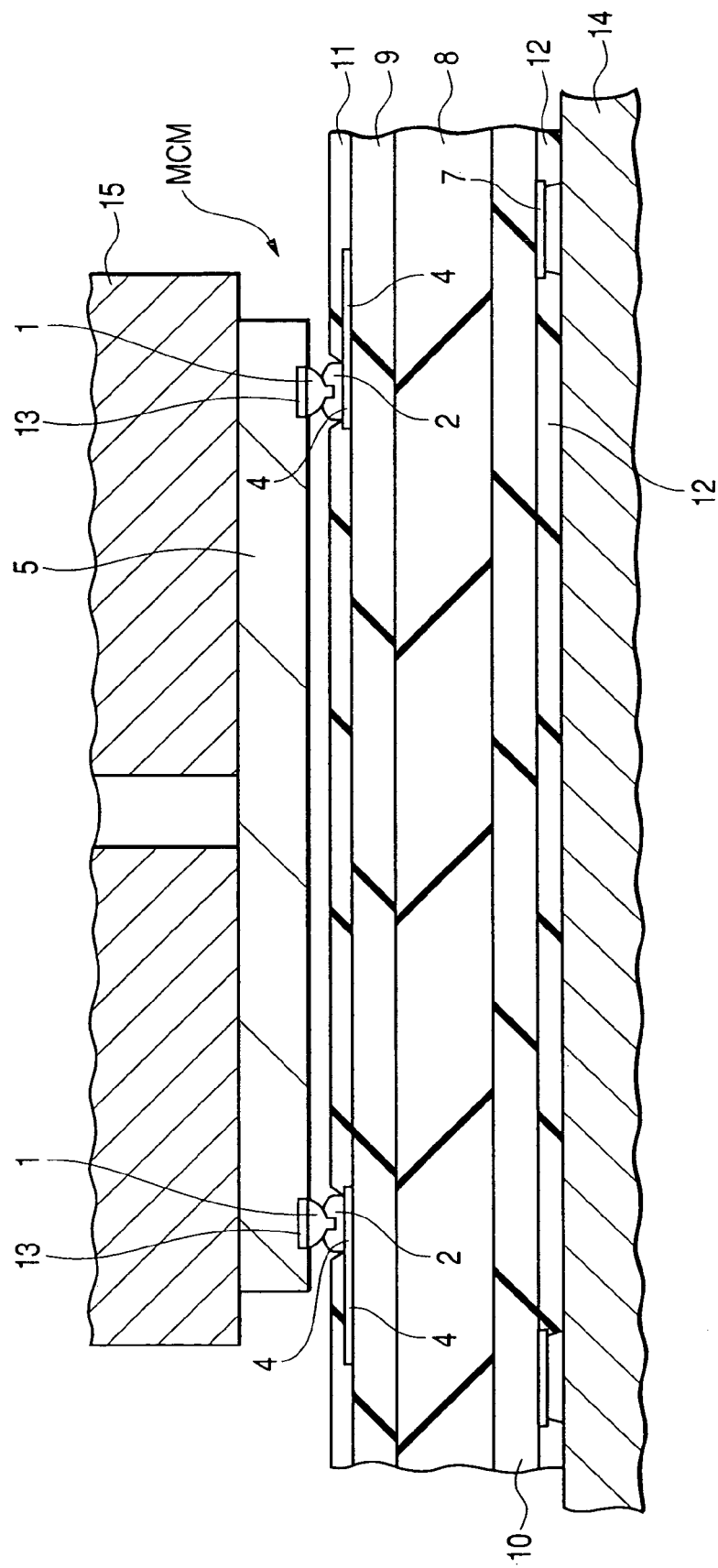
FIG. 14 is still another cross sectional view of the land grid array type multi-chip module in the above embodiment of the present invention.
Figure 15:
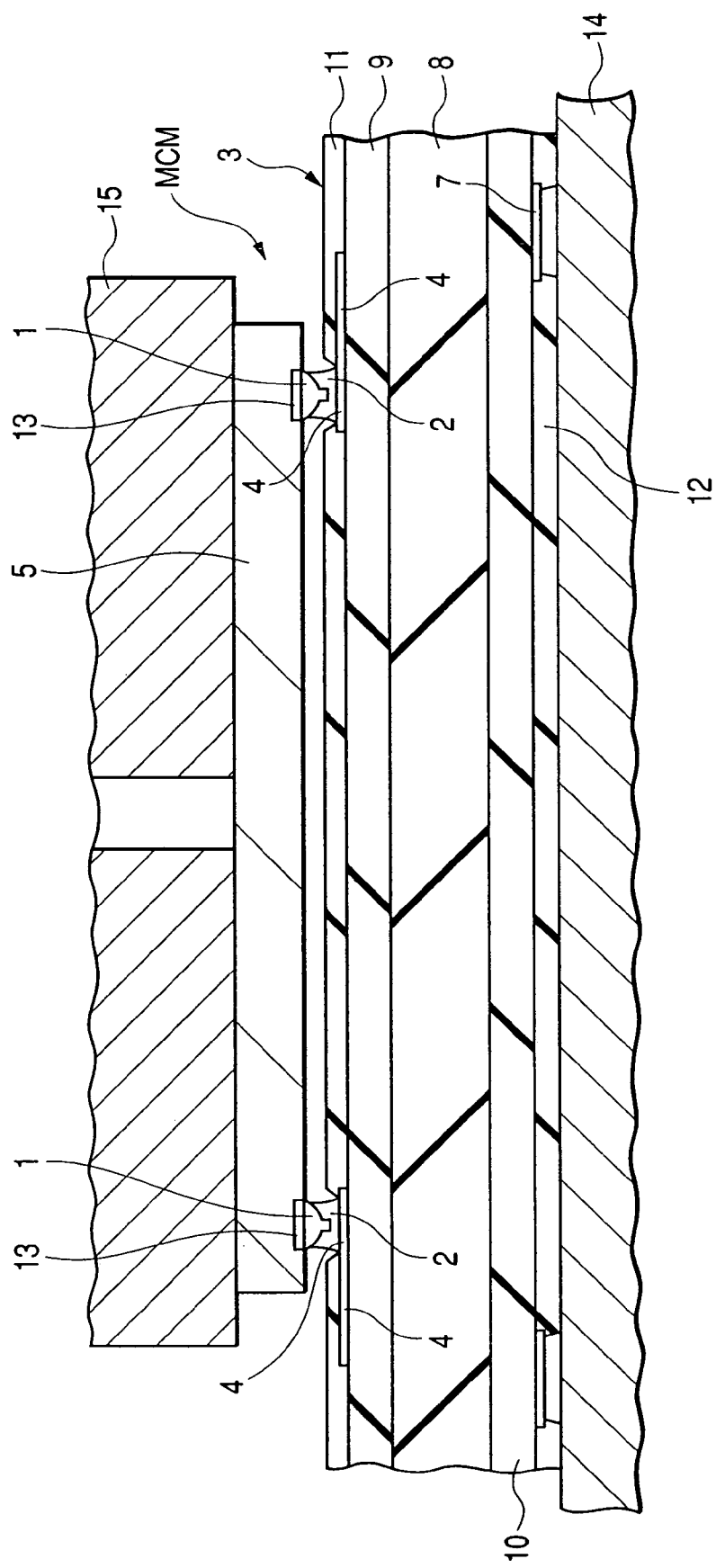
FIG. 15 is still another cross sectional view of the land grid array type multi-chip module in the above embodiment of the present invention.

Next, a description will be made for how to layout semiconductor chips such as the ASIC, etc. over the substrate of the multi-chip module MCM with reference to FIGS. 13 through 15. FIGS. 13 through 15 show cross sectional views of major portions of the MCM in manufacturing processes. As shown in FIG. 13, a paste-like joint 2 is supplied on the connecting part 4 disposed in a chip mounting area over a main surface of the substrate 3 with use of a dispensing method. The joint 2 may be solder paste obtained by mixing at least fine solder grains and a fluxing agent. The solder paste used in this embodiment is composed of 98[wt %]Pb-2[wt %]Sn having a fusion point of about 300° C. The dispensing method is a method for jetting solder paste from a thin nozzle to apply a coat of the solder paste onto the object.

Next, the substrate 3 is put on a heating stage 14 as shown in FIG. 14, then carry a semiconductor chip 5 into a chip mounting area with use of a collet 15 so that the stud bump 1 is positioned over a connection part 4. After that, the substrate 3 is heated at the heating stage 14 while the semiconductor chip 5 is heated in the collet 15, so that the joint 2 is fused as shown in FIG. 15. The fused joint 2 is then set. As a result, the semiconductor chip 5 is mounted in the chip mounting area provided over one main surface of the substrate 3.

Then, as shown in FIG. 10, under filling resin 6 is filled between the chip mounting area and the semiconductor chip 5 over one main surface of the substrate 3. After that, just like the MCM shown in FIGS. 1 through 6, SDRAMs are bonded back to back over the semiconductor chip 5, then the electrode pads of each SDRAM are connected to the corresponding connection parts 4 of the substrate 3 through bonding wires. After that, the FLASH 200 is layered over that and connected thereto through bonding wires. Finally, the four semiconductor chips (SAIC, SDRAMs, FLASH), as well as the bonding wires are sealed with resin to complete the multi-chip module MCM.

If an LGA type MCM is to be mounted over a PCB, a solder layer is printed at PCB side connection electrodes beforehand, then the land electrodes formed at the back side of the LGA type MCM are positioned over the PCB side connection electrodes. Then, the MCM is subjected to a solder reflow process, thereby the land electrodes are connected to the connection electrodes with the solder layer therebetween. Such a thin solder layer may also be printed at the land electrodes of the LGA type MCM beforehand, for example.

While a preferred embodiment of the present invention has been described, it is to be understood that modifications will be apparent to those skilled in the art without departing from the spirit of the invention. For example, both ASIC and FLASH may be layered in portions upper than their present locations. And, in the embodiment shown in FIG. 9, the spacer 400 may be replaced with the FLASH 200. For example, if the electrodes of the FLASH 200 are concentrated at one side of a square chip, that portion may be formed as a laminated layer so that the SDRAM is not mounted there. However, in that case, the SDRAM and FLASH chips are required to satisfy a relationship between their sizes as described above. The present invention will thus be applied widely to semiconductor devices structured as multi-chip modules.

What is claimed is:
1. A multi-chip module, comprising:
a first semiconductor chip laid out over a surface of a substrate;
a second semiconductor chip mounted over said first semiconductor chip back to back, said second semiconductor having a plurality of bonding pads at the periphery of its surface;
a spacer mounted at a portion of said surface of said second semiconductor chip, said portion not including a predetermined area that includes said portion where said bonding pads are formed;
a third semiconductor chip mounted over said spacer, having the same circuit function as that of said second semiconductor chip and being oriented similarly to said second semiconductor chip;

a plurality of bonding wires for connecting said bonding pads of both of said second and third semiconductor chips commonly to their corresponding electrodes formed over said substrate; and
  a sealing agent for sealing said first to third semiconductor chips, as well as said bonding wires provided over said substrate.

2. The multi-chip module according to claim 1, wherein the back side of said third semiconductor chip is insulated electrically.

3. The multi-chip module according to claim 2, wherein the electrical insulation property of said back side of said third semiconductor chip is realized by a die bond film stuck at a surface of said spacer.

4. The multi-chip module according to claim 3, wherein said spacer includes polycrystalline silicon.

5. The multi-chip module according to claim 4, wherein said second semiconductor chip is stuck on the surface of said first semiconductor chip with die bond film.

6. The multi-chip module according to claim 1, wherein said first semiconductor chip is smaller in size than any of said second and third semiconductor chips.

7. The multi-chip module according to claim 1, wherein a fourth semiconductor chip having a plurality of bonding pads at the periphery of its surface is further mounted at a portion of said surface of said third semiconductor chip, said portion of said third semiconductor chip not including a predetermined area that includes a portion where said plurality of bonding pads are formed, and
  wherein said plurality of bonding pads of said fourth semiconductor chip are connected to their corresponding electrodes formed over said substrate through a plurality of bonding wires.

8. The multi-chip module according to claim 7, wherein said first semiconductor chip enables information to be erased from/recorded in its non-volatile memory cells,
  wherein each of said second and third semiconductor chips enables information to be recorded in its dynamic memory cells, and
  wherein said fourth semiconductor chip includes a microprocessor.

9. The multi-chip module according to claim 7, wherein said first semiconductor chip has more connection electrodes than said fourth semiconductor chip.

10. The multi-chip module according to claim 9, wherein said first semiconductor chip includes a microprocessor,
  wherein each of said second and third semiconductor chips enables information to be recorded in their dynamic memory cells respectively, and
  wherein said fourth semiconductor chip enables information to be erased from/recorded in its non-volatile memory cells.

* * * * *